US007000678B1

(12) United States Patent
Mon et al.

(10) Patent No.: US 7,000,678 B1
(45) Date of Patent: Feb. 21, 2006

(54) ELECTROMAGNETIC CONTINUOUS CASTING APPARATUS FOR MATERIALS POSSESSING HIGH MELTING TEMPERATURE AND LOW ELECTRIC CONDUCTANCE

(75) Inventors: Byoung Moon Mon, Seoul (KR); Sang Mok Lee, Incheon (KR); Je Sik Shin, Gyeonggi-do (KR)

(73) Assignee: Korea Institute of Industrial Technology, (KR)

( * ) Notice: Subject to any disclaimer, the term of this patent is extended or adjusted under 35 U.S.C. 154(b) by 0 days.

(21) Appl. No.: 11/103,387

(22) Filed: Apr. 11, 2005

(30) Foreign Application Priority Data

Aug. 18, 2004 (KR) .................. 10-2004-0065177

(51) Int. Cl.
*B22D 27/02* (2006.01)
*B22D 27/04* (2006.01)

(52) U.S. Cl. ............... 164/507; 164/122.1; 164/338.1; 164/513; 373/138; 373/163

(58) Field of Classification Search ............. 164/471, 164/493, 507, 513, 122.1, 122.2, 338.1; 373/138, 373/163
See application file for complete search history.

(56) References Cited

U.S. PATENT DOCUMENTS

| 5,892,790 A | * | 4/1999 | Abiko et al. ................ 373/158 |
| 2003/0205358 A1 | * | 11/2003 | Kimura et al. ............... 164/493 |

FOREIGN PATENT DOCUMENTS

| JP | 4-123844 | * | 4/1992 |
| JP | 2001-19594 | | 1/2001 |

* cited by examiner

*Primary Examiner*—Kuang Y. Lin
(74) *Attorney, Agent, or Firm*—Harness, Dickey & Pierce, P.L.C.

(57) ABSTRACT

Disclosed is an electromagnetic continuous casting apparatus for a material having a low electric conductivity. The casting apparatus includes a crucible having a vertical axis. The crucible comprises an upper hot crucible and a lower cold crucible. The crucible is surrounded with an induction coil. The hot crucible is formed of a non-metallic material having a high electric conductivity and is not water-cooled. The cold crucible has a cooling structure and is formed of a metallic material having a high thermal conductivity and a high electric conductivity.

8 Claims, 7 Drawing Sheets

ELECTROMAGNETIC CONTINUOUS CASTING APPARATUS FOR MATERIALS POSSESSING HIGH MELTING TEMPERATURE AND LOW ELECTRIC CONDUCTANCE

BACKGROUND OF THE INVENTION

1. Field of the Invention

The present invention relates to an electromagnetic continuous casting apparatus for producing a high-purity polycrystalline ingot of semiconductive materials or metallic materials having a high melting temperature and a low electric conductance such as a silicon ingot used for a solar cell substrate.

2. Background of the Related Art

In general, the aforementioned type silicon ingot is used as a starting material for manufacturing silicon wafers, for example, which are used as photovoltaic elements such as solar cells.

Conventionally, in order to manufacture a polycrystalline silicon wafer for solar cells, firstly, silicon is melted inside a graphite crucible or inside a quartz crucible placed inside a graphite crucible. Thereafter, an ingot is produced by slowly cooling the mold (or crucible) from the bottom thereof such that the melt can be directionally solidified. The ingot is sliced into wafers having a thin thickness of below 500 $\mu$m. This method has been widely used, but embraces some problems in that the silicon ingot is contaminated by carbon and oxygen introduced from the graphite or quartz crucible, and the quartz crucible is fractured during solidification of silicon and must be replaced with a new one every time to thereby increase the manufacturing cost. On the other hand, the quality and cost of silicon wafers depend on those of the ingot. Therefore, recently, an electromagnetic continuous casting process has been introduced, in which the introduction of impurities can be suppressed to thereby improve the quality of silicon wafer, and loss of the crucible and mold can be alleviated to thereby improve its productivity and consequently reduce the manufacturing cost.

FIG. 1 schematically shows a conventional electromagnetic continuous casting machine. As shown in FIG. 1, the conventional electromagnetic continuous casting machine includes an induction coil 1, and a continuous casting-type cold crucible 2 disposed inwards of the induction coil 1. The cold crucible is made of a conductive material (commonly, oxygen free copper, OFC) and opened at its bottom.

FIG. 2 is a perspective view showing a cross-section of the cold crucible in the conventional electromagnetic continuous casting machine in FIG. 1. Referring to FIGS. 1 and 2, the cold crucible 2 is structured in such a manner that at least part of the crucible along the circumference thereof is divided into plural segments by vertical slits 3. For the purpose of solidification of a melt and protection of the cold crucible 2, a water cooling system is provided, by which a cooling water passes inside the crucible.

Due to these longitudinal slits 4, the electromagnetic field, which is generated by a high-frequency current of the induction coil 1, can be permeated into the inside of the cold crucible 2 and generates an induced current in the melting material. Accordingly, the melting materials, which are continuously charged, are heated and melted by means of the joule heating effect. Simultaneously, an electromagnetic force is always generated towards the inside of the cold crucible 2 such that the contact between the melting materials and the inner wall of the crucible can be alleviated. This phenomenon due to the electromagnetic force is called pinch effect or electromagnetic pressure effect.

In the electromagnetic continuous casting process, since the contact with the crucible is suppressed as described above, contamination of the melt is alleviated and thus the quality of ingot can be improved. At the same time, the mold does not need to be replaced, thereby reducing the installation cost thereof and improving the productivity therefor. In addition, it has an advantage of enabling a continuous casting and providing a good production efficiency, thereby manufacturing an economically efficient ingot.

However, since the above conventional electromagnetic continuous casting process uses a water-cooled cold crucible, it has difficulties in making a material, which has a high melting temperature and a low electric-conductivity, a high-purity ingot. That is, while in case of steel or aluminum materials which do not necessitate high purity, there exists an antecedent process for melting the raw materials before casting and the cold crucible is wholly used for casting process, in case of a high-purity ingot, the melting process and the casting process should be carried out simultaneously and continuously inside the cold crucible. Therefore, a great deal of electric power is required for melting the raw materials.

In particular, since silicon is a semiconductive material having a high melting point and a low electric conductivity, a cooling effect by the emission of radiant heat is high, but, in contrast, the induction heating effect is weak. Thus, it causes difficulties in melting the silicon material continuously and efficiently.

In order to solve the above problems in the art, currently a high capacity power source of around several hundreds kW has been used. Alternatively, Japanese Laid-open Patent Application No. 2001-19594 discloses a method of forming a silicon melt inside a bottom open type crucible, in which an additional plasma arc-heating source is used, together with the induction heating by an induction coil, which is disposed around a crucible. However, this method leads to a high installation cost and also a high production cost disadvantageously.

SUMMARY OF THE INVENTION

Therefore, the present invention has been made in view of the above problems, and it is an object of the present invention to provide a convenient electromagnetic continuous casting apparatus for producing a high-purity polycrystalline ingot, in which the heating and melting efficiency of a raw material having a high melting point and a low electric conductance can be remarkably improved, and also the electromagnetic pressure can be maintained higher than the hydrostatic pressure due to the melt height throughout the melt region.

To accomplish the above object, according to one aspect of the present invention, there is provided an electromagnetic continuous casting apparatus for a material having a high melting temperature and a low electric conductivity. The casting apparatus includes a crucible having a vertical axis. The crucible comprises an upper hot crucible and a lower cold crucible. The crucible is surrounded with an induction coil. The hot crucible is formed of a non-metallic material having a high electric conductivity and is not water-cooled, and the cold crucible has an internal water-cooling structure and is formed of a metallic material having a high thermal conductivity and a high electric conductance.

The hot crucible is structured in such a manner that the upper end portion thereof is integrally formed along its circumference and at least part of the lower end portion thereof along the circumference is divided into several segments by vertical slits. The cold crucible is structured in such a manner that at least part thereof along the circumference is divided into several segments by means of vertical slits formed from the top to the bottom.

At least part of the vertical slits is extended in straight line throughout the hot crucible and the cold crucible.

The material having a low electric-conductivity may include a semiconductor material having a high melting point. The semiconductor material having a high melting point may include silicon.

The material having a low electric-conductivity may include a metallic material having a high melting point.

The non-metallic material may include graphite.

The hot crucible may be surrounded with an insulation material, through which an electromagnetic field can permeate.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
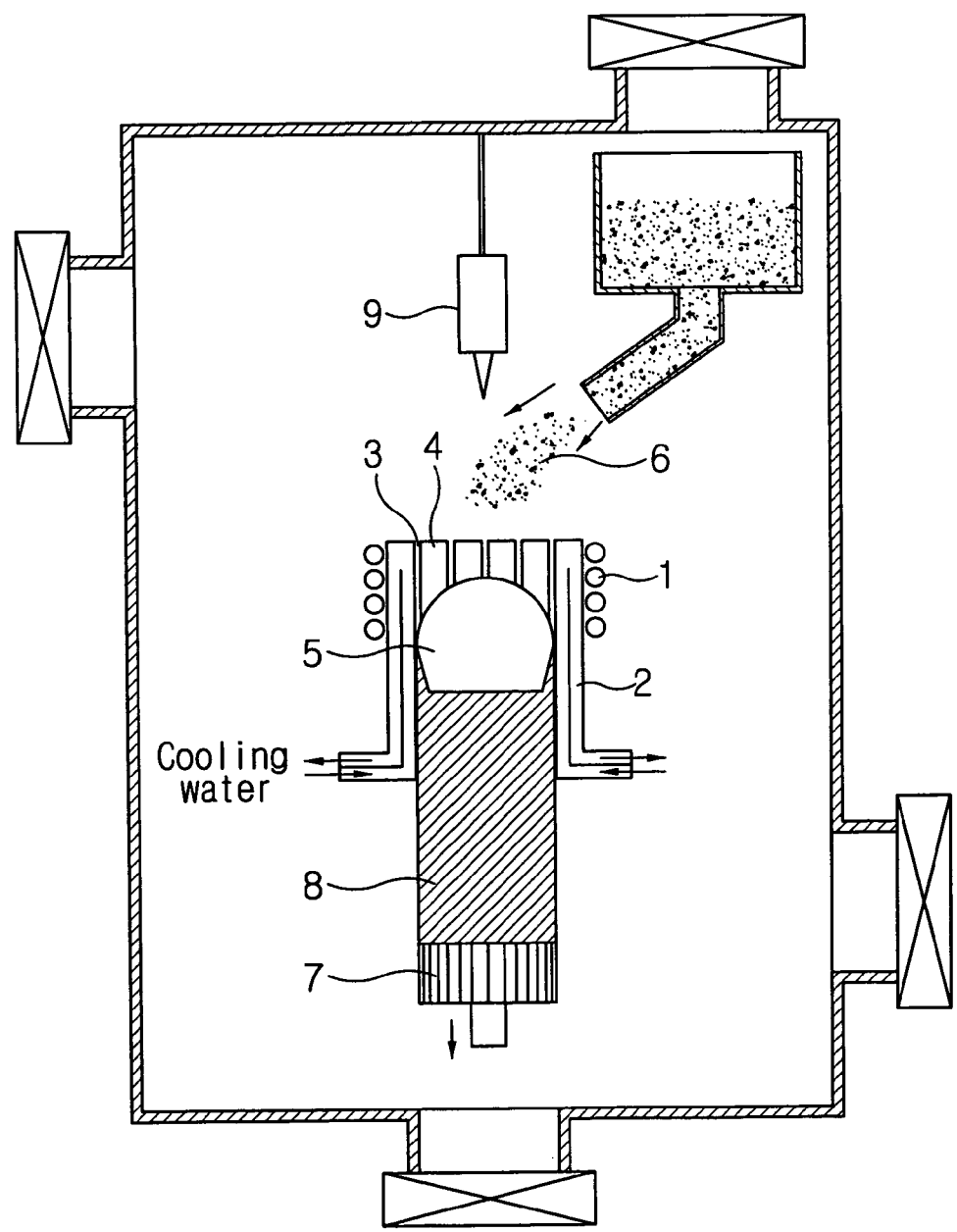
FIG. 1 schematically shows a conventional electromagnetic continuous casting machine.

The preferred embodiments of the invention will be hereafter described in detail, with reference to the accompanying drawings.

In a typical electromagnetic continuous casting process using only a cold crucible, generally, 70–80% of the induction heat value is generated in the cold crucible and thus lost through a cooling water medium, without contributing to the heating and melting raw materials.

In particular, since the hydrostatic pressure of a melt is proportional to the height of the melt, the top surface of a melt, to which a solid raw material is supplied, has a low hydrostatic pressure, so that the melt becomes further apart from the crucible wall. Therefore, the electromagnetic field is not easily concentrated near the top surface of the melt, thus reducing the induction heat value.

Here, in case of a material having a high melting point and a low electric conductance, if the current applied to an induction coil is not adequate, for example, due to a low capacity of high-frequency power source, the induction heating effect becomes lower than the cooling effect by emission of radiant heat. Thus, the melt is easily cooled and solidified, thereby failing to enable a continuously melting and casting process.

On the other hand, the hydrostatic pressure of the melt becomes higher gradually towards the top from the bottom of the melt. Therefore, at the lower portion of the melt, the electromagnetic pressure is relatively more important, rather than the heating effect, in order to maintain non-contact with the crucible.

Therefore, in order to solve the above problems, the present invention has designed an electromagnetic continuous casting apparatus, including a bottom open type crucible, for producing an ingot of a material having a high melting point and a low electric conductivity. The apparatus of the invention is structured and configured, in principle, as follows.

In the upper portion of the crucible, where a heating effect is more important than an electromagnetic pressure effect, is provided a hot crucible, which is not cooled when in use. The hot crucible is formed of a non-metallic material having a high melting temperature and simultaneously having a good electric conductance. Thus, the induction heat generated in the hot crucible contributes to heating of the melt.

In the lower portion of the crucible, where a electromagnetic pressure effect is more important than a heating effect and the melt starts to solidify, is provided a cold crucible, which is configured so as to maintain non-contact with the melt. The cold crucible is structured so as to be water-cooled, and made of a conductive metallic material having a high thermal conductivity.

Therefore, the crucible structure of the invention is configured such that the electromagnetic pressure can be maintained higher than the hydrostatic pressure of the melt throughout the entire height of the melt, significantly improving the melting efficiency of raw materials.

The hot crucible is constructed in such a manner that the upper end portion thereof is integrally formed along the circumference of the hot crucible and at least part of the lower end portion along the circumference thereof is divided into plural segments by means of vertical slits. The cold crucible is structured in such a way that at least part of the cold crucible along its periphery is divided into plural segments by means of vertical slits formed from the top to the bottom.

At least part of the vertical slits may be extended in straight line throughout the hot crucible and the cold crucible.

The non-metallic material forming the hot crucible is exemplified by a graphite material.

The hot crucible may be surrounded with an insulation material, which does not have a shielding effect of electromagnetic field.

Therefore, the electromagnetic continuous casting apparatus of the invention is suitable for producing an ingot, using a semiconductor material having a low electric conductance and a high melting temperature, such as silicon, or using a metallic material having a high melting point.

Hereafter, the preferred embodiments of the invention and the examples using each embodiment will be described, referring to FIGS. 3 to 5.

Figure 3:
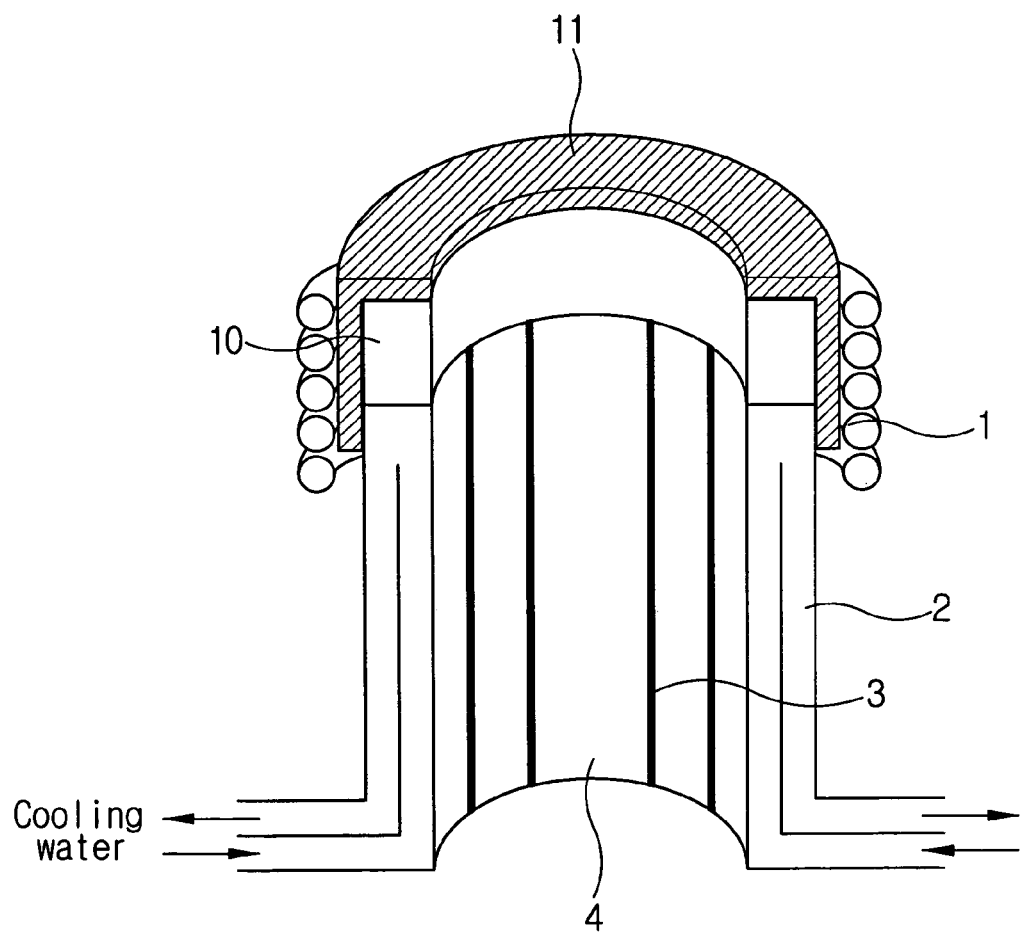
FIG. 3 is a cross-section of an electromagnetic continuous casting apparatus according to a first embodiment of the invention.

FIG. 3 is a cross-section of an electromagnetic continuous casting apparatus according to a first embodiment of the invention.

As illustrated in FIG. 3, the crucible according to the first embodiment is comprised of an upper hot crucible 10 and a lower cold crucible 2.

Figure 2:
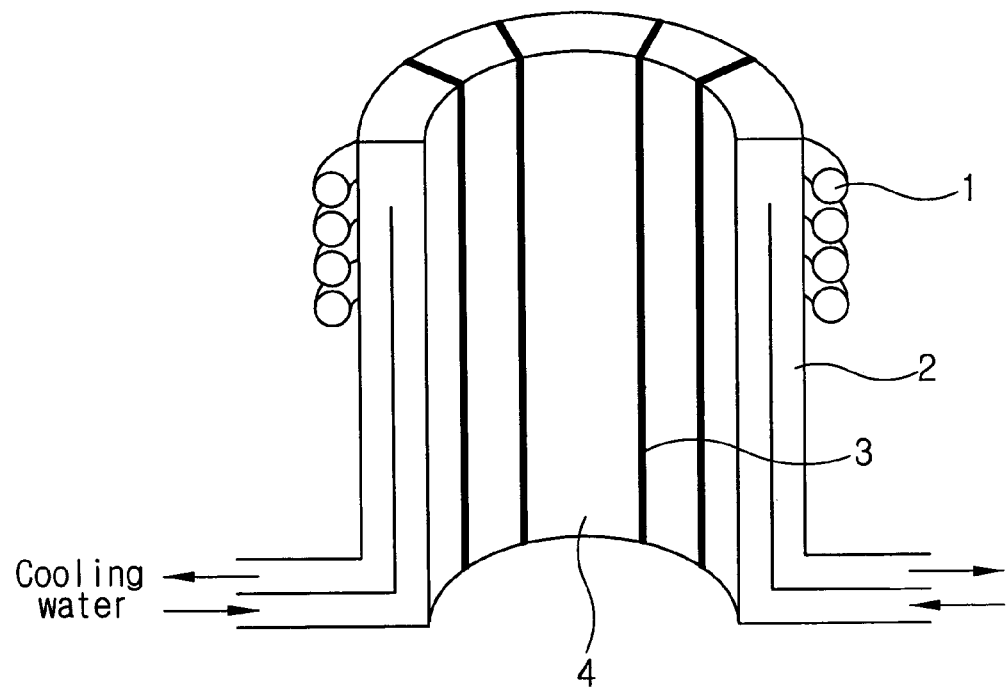
FIG. 2 is a perspective view showing a cross-section of the cold crucible in the conventional electromagnetic continuous casting machine in FIG. 1.

That is, the crucible of first embodiment is constructed in such a way as to place the hot crucible 10 on top of the cold crucible 2 of FIG. 2. The hot crucible may be formed of a graphite material and, for example, have an inner diameter of 50 mm, an outer diameter of 80 mm, and a height of 30 mm.

The hot crucible 10, where a heating effect is more important than an electromagnetic pressure effect, is formed of a non-metallic material having a high melting point and a good electric conductance, and does not have a cooling structure. Thus, the induction heat generated in the hot crucible is made to contribute to the heating of a melt. In contrast, the cold crucible 2, where an electromagnetic pressure effect is more important than a heating effect and a melt starts to solidify, is fabricated of a metallic material having a high thermal conductivity and a high electric conductance, and is structured so as to be water-cooled.

The cold crucible 2 is formed in such a manner that at least part of the cold crucible 2 along its circumference is divided into plural segments 4 by means of vertical slits 3 formed from the top to the bottom thereof.

The hot crucible 10 may be surrounded with an insulation material 11 having no shielding effect of electromagnetic field, thereby protecting the induction coil 1 and efficiently heating the raw material 6 (see FIG. 1).

Figure 4:
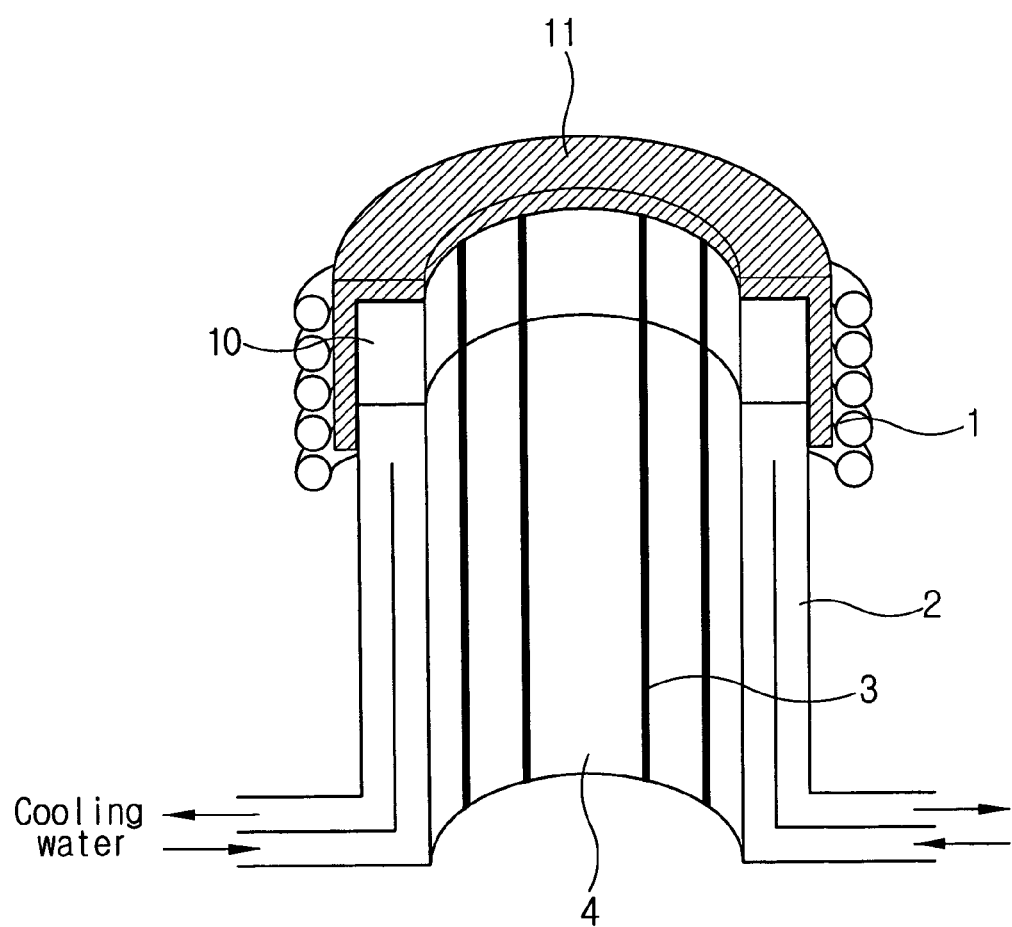
FIG. 4 is a cross-section of an electromagnetic continuous casting apparatus according to a second embodiment of the invention.

FIG. 4 is a cross-section of an electromagnetic continuous casting according to a second embodiment of the invention. As shown in FIG. 4, in the second embodiment of the invention, the hot crucible 10, for example, made of a graphite material, is divided into plural segments 4 by means of vertical slits 3, for example, 12 segments by means of 12 slits. The hot crucible has, for example, an inner diameter of 50 mm, an outer diameter of 80, and a height of 30 mm. Similar to the first embodiment, the crucible of this embodiment is structured in such a way that the above-constructed hot crucible 10 is placed on top of the cold crucible 2 of FIG. 2. The vertical slits 3 formed in the non-metallic hot crucible 10 and in the conductive cold crucible 2 are made to be coincided with each other at the boundary between the hot and cold crucibles, so as not to disturb the electromagnetic force.

Figure 5:
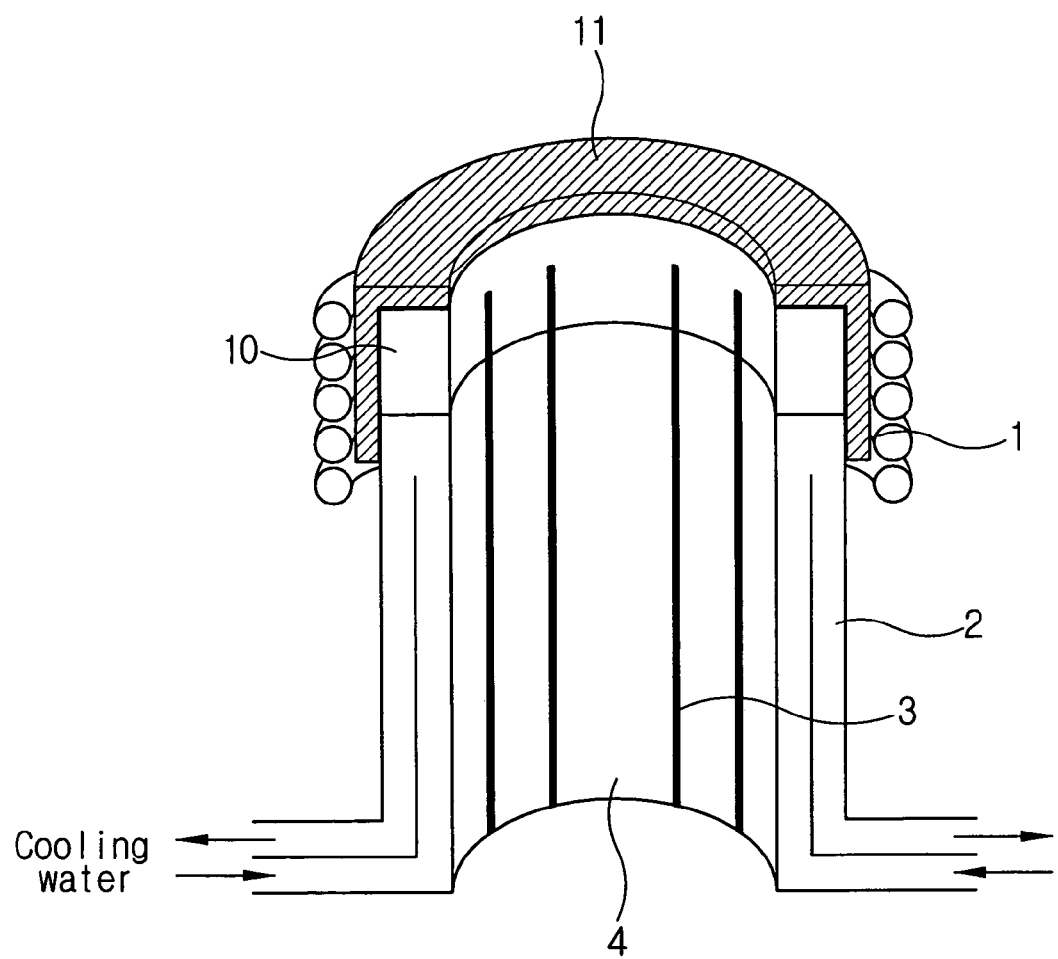
FIG. 5 is a cross-section of an electromagnetic continuous casting apparatus according to a third embodiment of the invention.

FIG. 5 is a cross-section of an electromagnetic continuous casting apparatus according to the third embodiment of the invention. As shown in FIG. 5, in the third embodiment of the invention, the hot crucible 10, for example, made of a graphite material, is integrally formed at its upper end portion along the circumference thereof. The lower end portion of the hot crucible 10 is divided into plural segments 4 by means of vertical slits 3, for example, 12 segments by means of 12 slits each having a length of, for example, 20 mm. The hot crucible has, for example, an inner diameter of 50 mm, an outer diameter of 80, and a height of 30 mm. The vertical slits 3 formed in the lower end portion of the non-metallic hot crucible 10 and in the conductive cold crucible 2 are made to be coincided with each other at the boundary between the hot and cold crucibles, so as not to disturb the electromagnetic force.

EXAMPLES 1, 2 and 3

The following examples are provided for further understanding of the invention, but not intended to limit the invention.

In the examples 1, 2, and 3, silicon melting and casting experiments have been carried out, respectively using the crucible of first, second, and third embodiment respectively, which are shown FIGS. 3 to 5. The results have been quantitatively compared, in terms of their induction heating effect and electromagnetic pressure effect.

In all examples, an induction coil 1 of five turns having an inner diameter of 125 mm, an outer diameter of 145 mm, and a height of 54 mm was installed outside of the crucible, in such a way that the top of the induction coil 1 is placed at a distance of 5 mm from the top of the crucible. An alternating current of 20 kHz was applied up to a maximum of 1,230 A.

Referring to FIG. 1, in order to perform a continuous casting, first, a dummy bar 7 was used to close the bottom of the crucible and then raw materials 6 were charged inside the crucible. An initial melt 5 was formed such that the dome of melt was reached to 5 mm below the top of the crucible. Thereafter, the dummy bar 7 was continuously descended, while continuously supplying the raw materials 6, thereby enabling to continuously manufacture an ingot 8.

Figure 7:
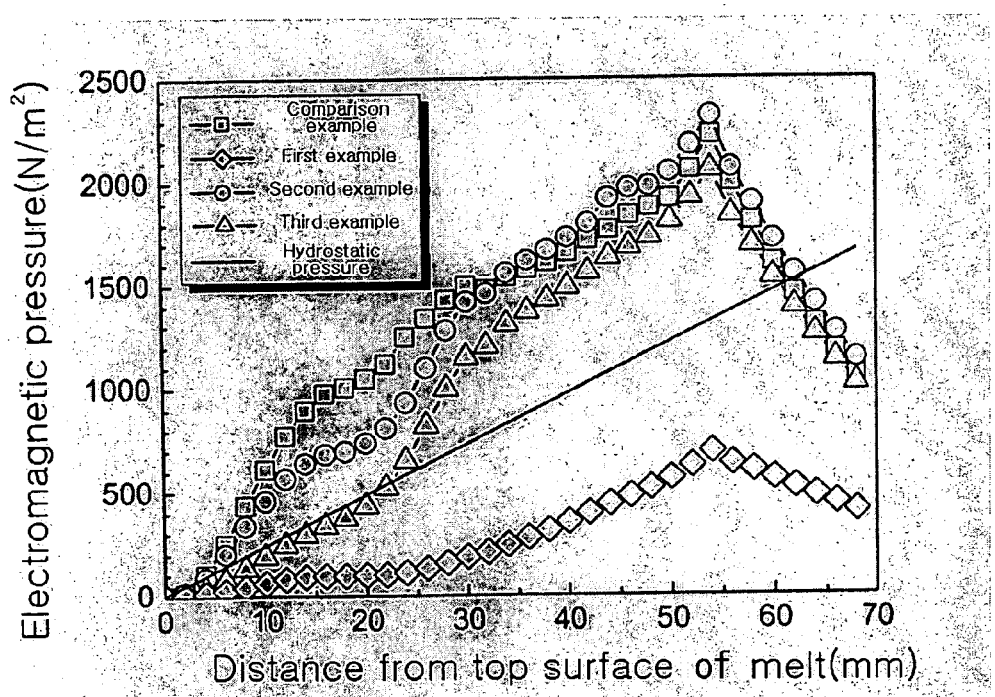
FIG. 7 is a graph showing the electromagnetic pressure and the hydrostatic pressure of melt in the examples and the comparison example.

In the example 1 using the crucible according to the first embodiment, the induction heat generated in the hot crucible 10 made of graphite was not lost through the cooling water, but contributed to heating and melting of the raw material 6, thereby enabling a continuous melting process. It has been found that the contact between the melt 5 and the crucible is not suppressed. It is because the electromagnetic pressure is lower than the hydrostatic pressure of the melt 5, which thus cannot be kept non-contacted with the crucible, as understood from FIG. 7. FIG. 7 will be explained hereinafter.

In the example 2 using the second embodiment of crucible of FIG. 2, the electromagnetic pressure was improved so that the contact between the melt 5 and the crucible was suppressed. However, in case of charging the raw materials 8 after the initial melt 5 was formed, a solidified film was easily formed on the surface of the melt, thereby failing to carry out a continuous melting process, similar to the comparison example. It seems because around half of the total induction heat value is generated in the cold crucible and lost through the crucible cooling process, as seen from Table 1. The comparison example and Table 1 will be described hereinafter.

In the example 3 using the crucible of the third embodiment of the invention, a continuous melting and casting process was able to be carried out, while charging the raw materials 6 at a speed of above 170 g/min, and also the contact between the melt 5 and the crucible was suppressed.

COMPARISON EXAMPLE

In the comparison example, the conventional crucible of FIG. 2 was used. As shown in FIG. 2, the convention crucible includes an induction coil 1 and a bottom open-type cold crucible 2 disposed inside the induction coil 1. The cold crucible 2 is made of a conductive material. In addition, the cold crucible 2 is comprised of a plurality of segments 4 arranged along the circumference thereof, which are divided by means of vertical slits 3. Furthermore, the crucible is structured so as to be water-cooled, for the purpose of solidification of a melt 5 and protection of the crucible. The conventional crucible used in the comparison example has an inner diameter of 50 mm, an outer diameter of 80 mm, and a length of 200 mm, and the number of slits 3 is 12, the length of the slit 3 is 150 mm. An oxygen free copper was used to fabricate the conventional crucible.

In the comparison example, it was very difficult to perform a continuous melting and casting process, after an initial melt 5 was formed. It is because the silicon material has a low electric conductivity and a high melting point, and thus the cooling effect through emission of radiant heat is higher than the induction heating effect, thereby easily cooling the melt 5.

Figure 6:
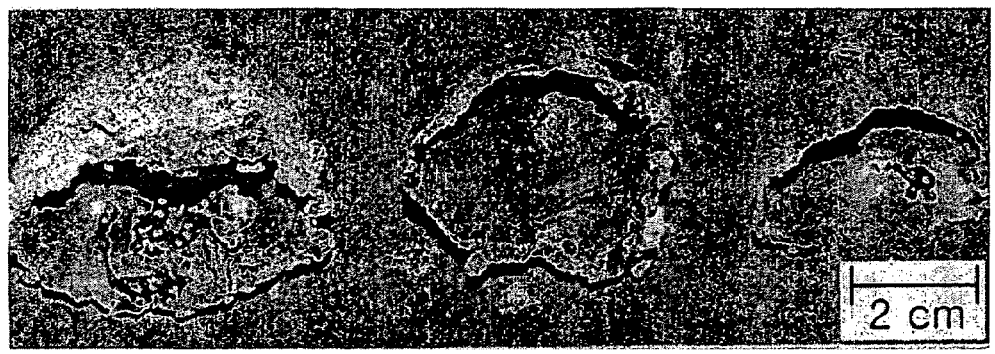
FIG. 6 shows solidified films formed on the surface of a melt in the comparison example using a conventional electromagnetic continuous casting machine.

In addition, the upper portion of the melt 5 is farther apart from the crucible wall, and thus has a weak electromagnetic field and consequently a decreased induction heating effect. Accordingly, in case of supplying the solid raw materials 6 to the upper portion of the melt 5, solidification films as shown in FIG. 6 were formed on the surface of the melt 6, so that a continuous melting process was not able to be carried out.

In order to quantitatively compare the induction heating effect and the electromagnetic pressure effect in each example and comparison example, the induction heat value and the electromagnetic pressure were calculated and summarized in Table 1 and FIG. 7, using a commercial program OPERA-3D for an electromagnetic field analysis.

TABLE 1

Induction heat value in examples and comparison example.

| | Cold crucible (kW) | Hot crucible (kW) | Silicon melt (kW) |
|---|---|---|---|
| Comparison Example | 11.04 | | 5.39 |
| Example 1 | 5.15 | 19.13 | 1.47 |
| Example 2 | 9.52 | 4.18 | 5.48 |
| Example 3 | 8.40 | 14.58 | 4.60 |

As understood from the calculation results in Table 1, in the conventional electromagnetic continuous casting process where only a cold crucible 2 is used as in the comparison example, around 67% of the entire induction heat value is generated in the cold crucible 2 and then lost by the cooling process. However, in the examples 1, 2, and 3 where a hot crucible 10 partially divided by vertical slits 3 or integrally formed is placed on top of the cold crucible 2, only 20~30% of the total induction heat value is generated in the cold crucible 2 and lost by water-cooling.

FIG. 7 is a graph showing the calculated electromagnetic pressure and the calculated hydrostatic pressure of the melt in the examples and the comparison example. As seen from the calculation result in FIG. 7, in the example 1 where a graphite hot crucible 10 having no slits was used, the electromagnetic pressure was lower than the hydrostatic pressure of the melt 5 and thus the melt 5 could not be easily maintained non-contacted with the crucible. In case where at least the lower end portion of the hot crucible 10 is divided into segments by vertical slits 3 as in the examples 2 and 3, it has been found out that the electromagnetic pressure can be maintained equal to or higher than the hydrostatic pressure of the melt 5.

As in the example 3, the crucible of an electromagnetic continuous casting apparatus is constructed in such a manner that the upper portion thereof (upper crucible) is formed of a non-metallic material having a good electric conductivity such as graphite and is not water-cooled, and the lower portion thereof (lower crucible) is formed of a conductive metallic material having a high thermal conductivity and has a water cooling structure. At the same time, the upper end portion of the upper crucible is integrally formed along its circumference, and the lower end portion of the upper crucible is divided into plural segments 4 along its circumference by means of vertical slits 3. With the above construction, therefore, the silicon material having a high melting point and a low electric conductance can be efficiently and continuously melted and cast, while maintaining a non-contact state with the crucible.

As described above, according to the electromagnetic continuous casting apparatus of the present invention, the electromagnetic pressure can be maintained higher than the hydrostatic pressure of a melt throughout the melt, while improving the heating and melting efficiency of a raw material, thereby enabling to carry out an electromagnetic continuous casting of semiconductor or metallic materials having a high melting point and a low electric conductance.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

This application claims foreign priority to Korean patent application KR10-2004-0065177 filed Aug. 18, 2004 which is hereby incorporated by reference.

What is claimed is:

1. An electromagnetic continuous casting apparatus for a low electric-conductive material, the casting apparatus including a crucible having a vertical axis, wherein the crucible comprises an upper hot crucible and a lower cold crucible, the crucible is surrounded with an induction coil, the hot crucible is formed of a non-metallic material having a high electric conductivity and is not water-cooled, and the cold crucible has an internal cooling structure and is formed of a metallic material having a high thermal conductivity and a high electric conductivity.

2. The casting apparatus according to claim 1, wherein the hot crucible is structured in such a manner that the upper end portion thereof is integrally formed along the circumference and at least part of the lower end portion thereof along the circumference is divided into segments by vertical slits, and the cold crucible is structured in such a manner that at least part thereof along the circumference is divided into segments by means of vertical slits formed from the top to the bottom thereof.

3. The casting apparatus according to claim 2, wherein at least part of the vertical slits is extended in straight line throughout the hot crucible and the cold crucible.

4. The casting apparatus according to claim 1, wherein the low electric-conductive material includes a semiconductor material having a high melting point.

5. The casting apparatus according to claim 4, wherein the semiconductor material having a high melting point includes silicon.

6. The casting apparatus according to claim 1, wherein the low electric-conductive material includes a metallic material having a high melting point.

7. The casting apparatus according to claim 1, wherein the non-metallic material includes graphite.

8. The casting apparatus according to claim 1, wherein the hot crucible is surrounded with an insulation material, through which an electromagnetic field can permeate.

* * * * *